United States Patent
Inoue et al.

(10) Patent No.: US 6,735,087 B2
(45) Date of Patent: May 11, 2004

(54) MODULE AND SURFACE-MOUNTED MODULE

(75) Inventors: Akira Inoue, Tokyo (JP); Shigenori Nakatsuka, Hiroshima (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/222,850

(22) Filed: Aug. 19, 2002

(65) Prior Publication Data

US 2003/0137809 A1 Jul. 24, 2003

(30) Foreign Application Priority Data

Jan. 23, 2002 (JP) ......................................... 2002-014369

(51) Int. Cl.$^7$ .............................. H05K 1/00; H05K 7/02
(52) U.S. Cl. ...................... 361/736; 361/760; 361/767; 361/808; 174/260
(58) Field of Search .................................. 361/736, 748, 361/760, 761, 728, 795, 749, 750, 777, 783, 799, 807, 808, 812, 767, 775; 174/250, 260; 257/678

(56) References Cited

U.S. PATENT DOCUMENTS

| | | | | |
|---|---|---|---|---|
| 4,858,071 A | * | 8/1989 | Manabe et al. | 361/386 |
| 5,423,080 A | * | 6/1995 | Perret et al. | 455/90 |
| 5,426,563 A | * | 6/1995 | Moresco et al. | 361/689 |
| 5,625,169 A | * | 4/1997 | Tanaka | 174/250 |
| 5,963,429 A | * | 10/1999 | Chen | 361/764 |
| 6,031,723 A | * | 2/2000 | Wieloch | 361/719 |
| 6,046,409 A | * | 4/2000 | Ishii et al. | 174/255 |
| 6,377,464 B1 | * | 4/2002 | Hashemi et al. | 361/760 |
| 6,628,526 B1 | * | 9/2003 | Oshima et al. | 361/760 |

OTHER PUBLICATIONS

Inoue, A., "High Efficiency 0.1cc . . . ", *IEICE Trans. on Electron.*, E.82–C(*11*), 1906–1912, Nov. 1999.

* cited by examiner

*Primary Examiner*—David Martin
*Assistant Examiner*—Dameon E. Levi
(74) *Attorney, Agent, or Firm*—Leydig, Voit & Mayer, Ltd.

(57) ABSTRACT

A surface-mounted module in which, after a module is assembled, each circuit element of the module can be evaluated. In addition, the whole module mounted on a substrate can be evaluated. The module including includes a module substrate; and circuit elements on the module substrate and insulated from one another, each circuit element having an independent function. Each circuit element, and the each circuit element has a terminal insulated from terminals of other circuit elements on a surface of the module substrate. A surface-mounted module further includes a base substrate that has a connection wiring to electrically connect two terminals on the module surface and supplies electric power to the module, and achieves functions by operating each circuit element connected via the wiring in response to the electric power supplied from the base substrate.

12 Claims, 9 Drawing Sheets

MODULE AND SURFACE-MOUNTED MODULE

BACKGROUND OF THE INVENTION

1. Field of the Invention

The present invention relates to a configuration of a surface-mounted module.

2. Description of Background Arts

FIG. 1 is a perspective view of a conventional surface-mounted module 111. Module 111 is a high-frequency circuit such as a high-frequency, high-output amplifier. On multi-layer substrate 6 of module 111, a circuit element 7 and a circuit element 8, which are units of individual functions, are mounted. Circuit element 7 and circuit element 8 include chip parts 3 and wiring 4. Chip parts 3 and wiring 4 are connected to wiring inside the layer or an LCR element through a via hole 5.

Next description will be made on connections between module 111 and a base substrate 2. Module 111 is mounted on the surface of base substrate 2 by soldering such as reflow, or other methods. FIG. 2 is a diagram showing the configuration of the rear surface of module 111 (FIG. 1). As clear from the diagram, module 111 (FIG. 1) has a plurality of electrodes 9 and a comparatively large grounding electrode 10 on the rear surface. It is connected to module 111 and wiring 4 (FIG. 1) on base substrate 2 via a plurality of electrodes 9 disposed at four corners of module 111 rear surface. The other grounding electrode 10 is connected to grounding wiring 40 (FIG. 1) on base substrate 2 by soldering, etc. Grounding electrode 10 occupies nearly the remainder of the area except electrode 9, and this configuration can thereby achieve satisfactory heat radiating characteristics and high-frequency characteristics.

Referring now again to FIG. 1, circuit element 7 and circuit element 8 of module 111 are constructed by electrically connecting them to the inside or the surface of module 111. Because the characteristics of each of circuit elements 7, 8 vary, evaluating, sorting out, and adjusting the radio frequency (RF) characteristics for each circuit element when module 111 is manufactured can improve the yield of module 111.

However, as shown in FIG. 1, when circuit elements 7 and 8 are mounted on module 111, circuit elements cannot be evaluated individually. Consequently, the process yield of the whole module 111 is poor and a high manufacturing cost results.

SUMMARY OF THE INVENTION

It is an object of the present invention to enable the evaluation of each module circuit element even after the module is assembled. It is another object of the present invention to enable the evaluation of the whole module mounted on the substrate.

The module according to the present invention includes a module substrate; and a plurality of circuit elements formed on the module substrate and insulated from one another, each circuit element being equipped with an independent function, wherein the module achieves a specified function by operating the each circuit element, and wherein the each circuit element has a terminal insulated from terminals of other circuit elements on a surface of the module substrate. According to this configuration, the high-frequency characteristics, etc. of each circuit element can be evaluated individually even after the module is formed. Sorting and adjusting each one of the circuit elements using the evaluation results enables the high-yield manufacture of modules. Consequently, the module manufacturing cost can be reduced.

The surface-mounted module according to the present invention includes a module that has a module substrate and a plurality of circuit elements formed on the module substrate and being insulated one another, each circuit element being equipped with an independent function and having a terminal insulated from terminals of other circuit elements on a surface of the module substrate; and a base substrate that supplies electric power to the module and has a connection wiring to electrically connect terminals of at least two of the plurality of circuit elements on the surface of the module substrate, wherein the surface-mounted module achieves a specified function by operating the each circuit element according to the power supplied from the base substrate via the connection wiring. According to this configuration, each circuit element connected via connection wiring can be operated in accordance with the electric power supplied from the base substrate and the specified functions can be achieved.

The terminals may be formed on a first surface opposite to a second surface of the module substrate provided with the circuit element. Therefore, the area of the top layer of the module to which a large number of chip parts, etc. are to be mounted can be secured and a high degree of design freedom can be secured. The module may further includes a grounding electrode which grounds the each circuit element. The base substrate further includes a grounding wiring that connects and grounds the grounding electrode of the module and that surrounds the connection wiring. The connection wiring and the grounding electrode form a coplanar-type line. The module may further include a first grounding electrode which grounds the each circuit element. The base substrate may further include a second grounding electrode that connects and grounds the first grounding electrode. The connecting wiring and the grounding electrode form a slot-type line. In addition, the first grounding electrode of the module may surround the terminals. Alternatively, the first grounding electrode of the module may be disposed around the first surface.

Accordingly, the electric field can be confined between the grounding wiring and connection wiring and it could be free of influences of the lower layer of base substrate or the top layer of module substrate. Consequently, it becomes possible to connect circuit elements without impairing the high-frequency characteristics.

Another surface-mounted module according to the present invention includes a module that has: a module substrate; a plurality of circuit elements formed on the module substrate and being insulated one another, each circuit element being equipped with an independent function and having a terminal being formed on a first surface opposite to a second surface of the module substrate provided with the circuit element, said terminal electrically connecting to the circuit element by conductor; and a grounding electrode which grounds the each circuit element. The surface-mounted module further has a base substrate that connects and grounds the grounding electrode of the module and that supplies electric power to the module. The surface-mounted module achieves a specified function by operating the each circuit element according to the power supplied from the base substrate via a connection wiring. The first surface has a third surface at the position recessed from the outer circumferential position of the first surface, and the terminal is formed on the third surface. Because the terminal is kept away from the base substrate in a predetermined distance, the terminal is less susceptible to the base substrate. These are connected by conductors (for example, conductive wire, conductive chip, or metal).

The third surface is potted so as to cover the conductor. By this potting, the conductors are fixed and at the same time, solder rises to the terminals and prevents the terminals from shorting when the module and the base substrate are reflowed.

The grounding electrode may be formed on the third surface. The grounding electrode of the module will be formed at the recess to which the terminals of the circuit elements are installed. Accordingly, a signal needle and a grounding needle of a probe needle can be brought in contact to the module terminal and the grounding electrode located comparatively close and high-frequency characteristics of each circuit element can be individually evaluated.

The conductor may be at least one of conductive wire, conductive chip, and metal.

The terminal may be formed on the second surface of the module substrate. Therefore, the module can adopt a so-called flip-chip configuration for the base substrate and no connection path (via hole) is required from the surface on the circuit element side to the surface opposite to it, and the manufacturing cost can be reduced.

BRIEF DESCRIPTION OF THE DRAWINGS

This and other objects and features of the present invention will become clear from the subsequent description of a preferred embodiment thereof made with reference to the accompanying drawings, in which like parts are designated by like reference numerals and in which.

DETAILED DESCRIPTION OF THE PREFERRED EMBODIMENTS

Figure 1:
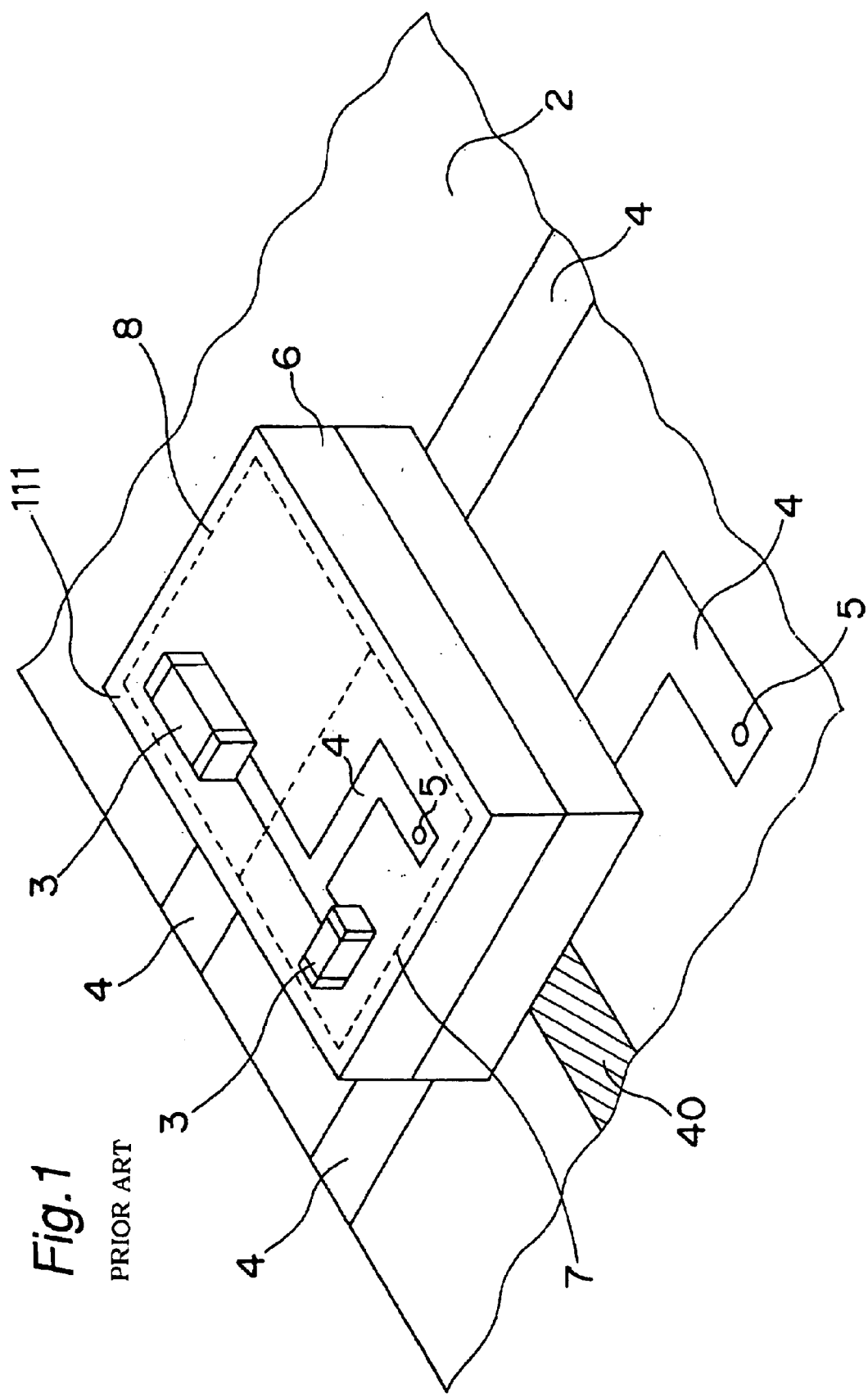
FIG. 1 is a perspective view of a conventional surface-mounted module.
Figure 2:
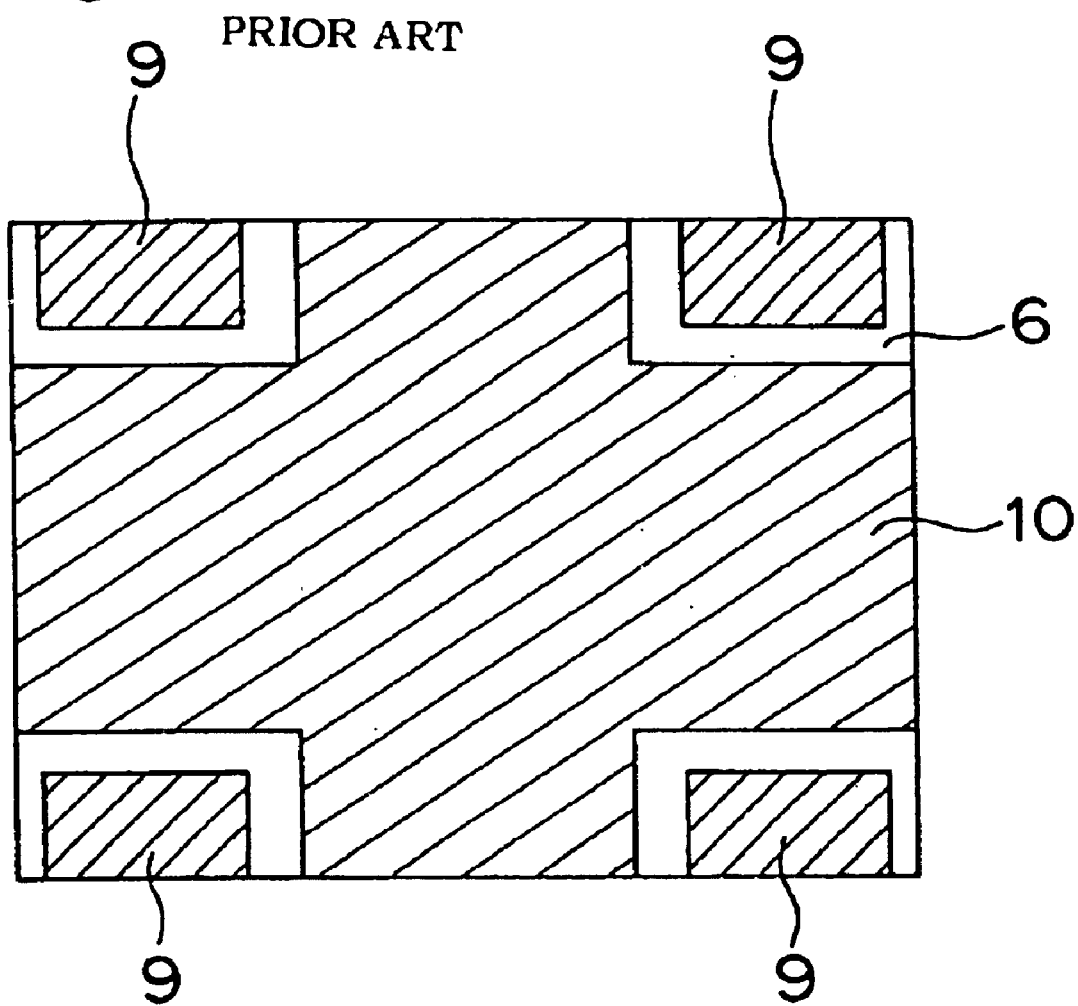
FIG. 2 is a diagram of the rear surface of the module.

Referring now to the drawings, examples of the optical disc apparatus according to the present invention will be described in detail hereinafter.

(Embodiment 1)

Figure 3:
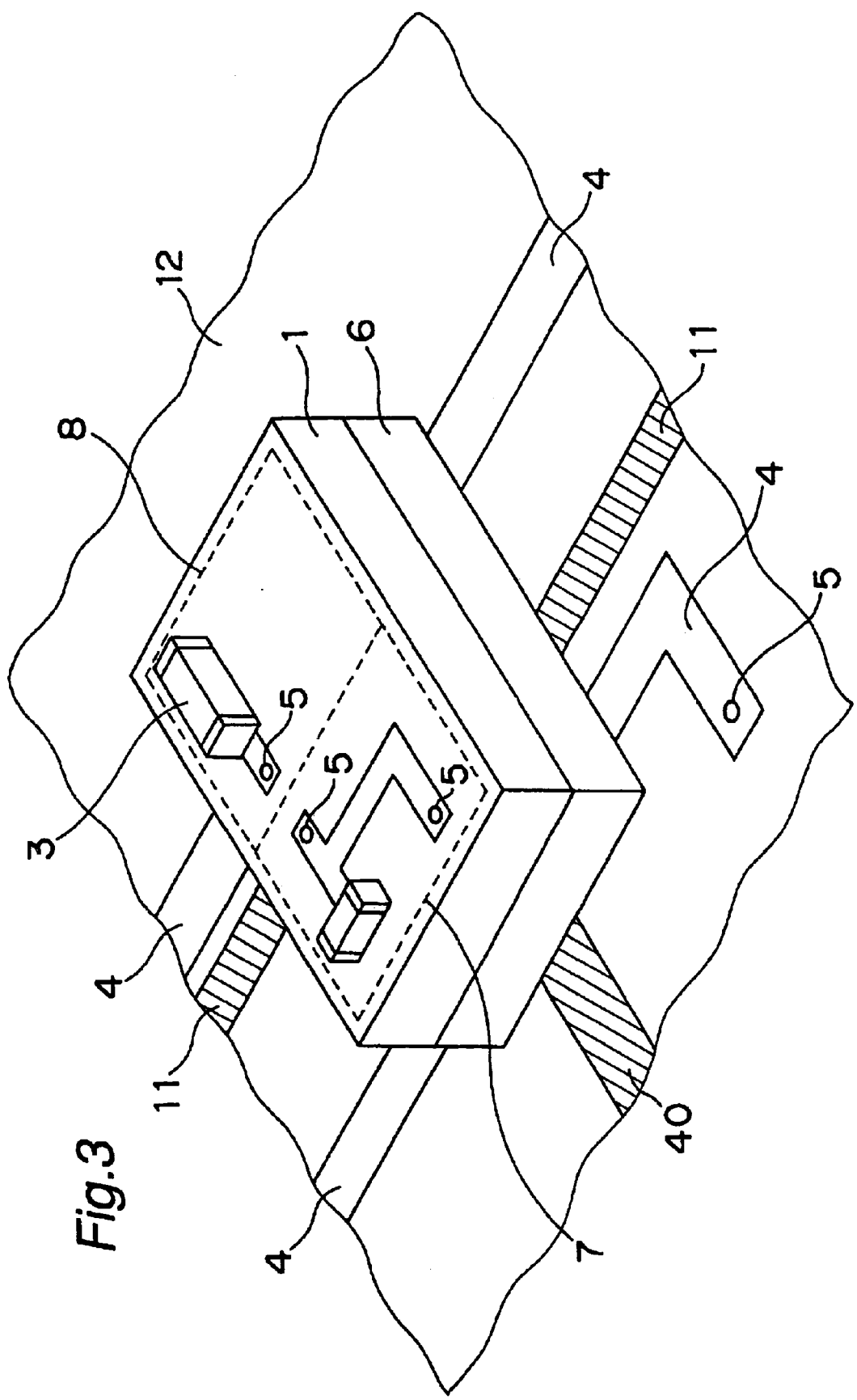
FIG. 3 is a perspective view of a module mounted on an evaluation board according to Embodiment 1.

FIG. 3 is a perspective view of a module 1 mounted on an evaluation board 12 according to Embodiment 1. Module 1 is a high-frequency circuit such as high-frequency high-output amplifier, and in general, has a circuit assembled on a dielectric substrate. For example, module 1 is a high-frequency circuit of 800 MHz or higher. On a multi-layer substrate 6 of module 1, a circuit element 7 and a circuit element 8 which are units of independent function are mounted. Circuit element 7 and circuit element 8 include chip parts 3 and wiring 4. Chip parts 3 and wiring 4 are connected to wiring of inner layer or LCR elements by via holes 5. Module 1 achieves a predetermined function, for example, high-frequency, high-output amplifying function, by the operation of each circuit element.

One of the primary features of the present invention is that circuit element 7 and circuit element 8 have no electrical contact inside and on the surface of module 1. In other words, circuit element 7 and circuit element 8 are insulated each other. According to the present invention, terminals of each circuit element are insulated, respectively, and terminals are connected on a substrate (not illustrated) to which module 1 is mounted.

Figure 4:
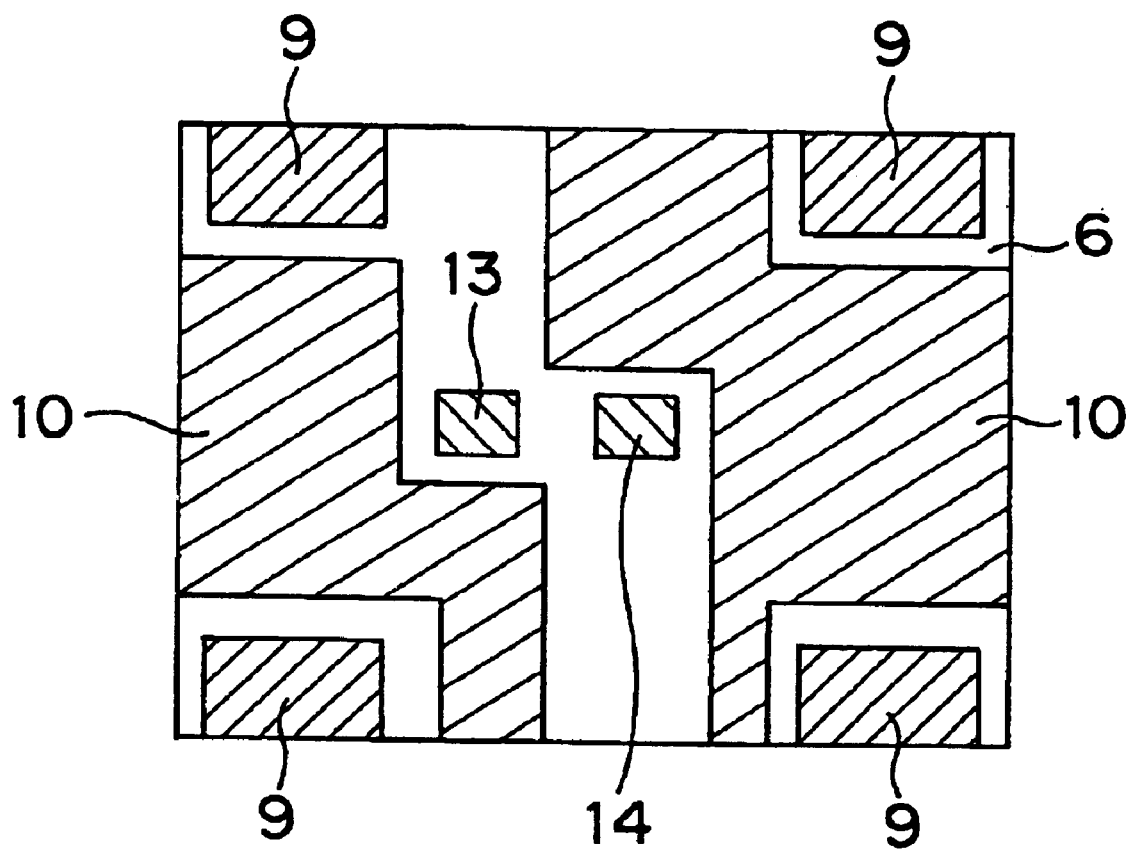
FIG. 4 is a diagram of the rear surface of the module.

Now, the description will be made on the configuration of module 1. FIG. 4 is a view showing a configuration of the rear surface of module 1 (FIG. 3). Module 1 (FIG. 3) has a plurality of electrodes 9, grounding electrodes 10, a terminal 13 of circuit element 7, and a terminal 14 of circuit element 8 on the rear surface. All the electrodes and terminals are not electrically connected and are insulated from one another. As illustrated, terminal 13 of circuit element 7 and terminal 14 of circuit element 8 are installed at the center section of the rear surface of module 1 (FIG. 3). In addition, terminal 13 of circuit element 7 and terminal 14 of circuit element 8 are not surrounded by grounding electrode 10, that is, they are installed between grounding electrodes 10 disposed separately.

Referring now again to FIG. 3, description will be made on how module 1 configured as shown in FIG. 4 is connected to evaluation board 12. Module 1 is connected to wiring 4 on evaluation board 12 via a plurality of electrodes 9 (FIG. 4) installed nearly 4 corners of the rear surface of module 1. Of the two grounding electrodes 10 (FIG. 4) on the rear surface of module 1, grounding electrode 10 (FIG. 4) closer to terminal 13 (FIG. 4) of circuit element 7 is connected to grounding wiring 40 on evaluation board 12.

Terminal 13 (FIG. 4) of circuit element 7 and terminal 14 (FIG. 4) of circuit element 14 are brought in contact with an evaluation wiring 11 mounted on evaluation board 12 and electrically connected. According to this connection, circuit element 7 and circuit element 8 can be separately evaluated. What must be noted is that either of grounding electrodes 10 (FIG. 4) of module 1 is configured with care to prevent shorting with evaluation wiring 11. That is, grounding electrode 10 (FIG. 4) of module 1 is not installed at the position in contact with evaluation line 11. In this way, because circuit elements 7, 8 are not connected in module 1, and each terminal of them is installed on the rear surface of module 1 to be connected via evaluation board 12, high-frequency characteristics of circuit elements 7, 8 can be evaluated separately. Furthermore, using the evaluation results, sorting out and adjusting each of circuit elements 7, 8 enable the manufacture of modules at a high yield, the module manufacturing cost can be reduced. Furthermore, because the evaluation terminal is installed on the rear surface of module 1, the area of the module 1 top layer to which a large number of chip parts, etc. are mounted can be secured, and the degree of design freedom can be improved.

Figure 5:
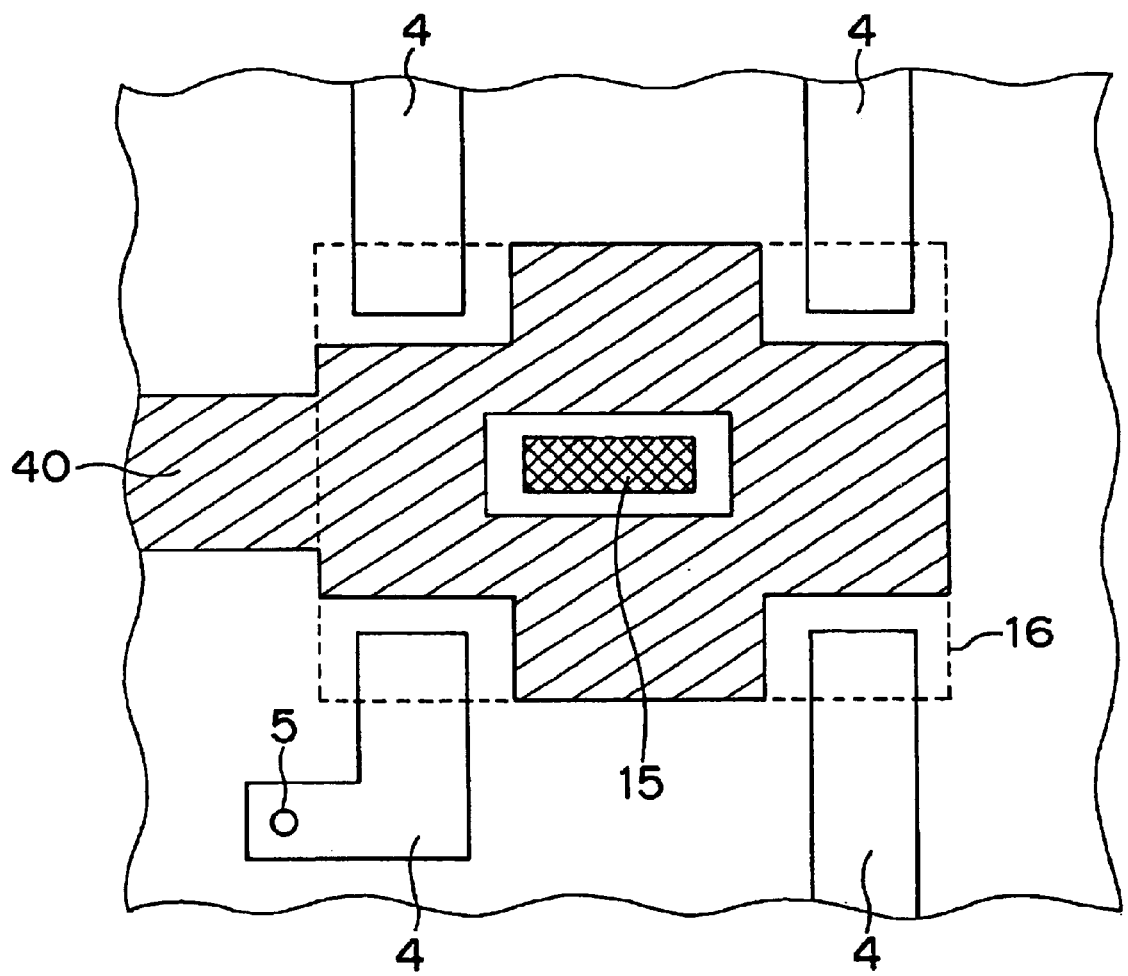
FIG. 5 is a diagram of a wiring pattern of the base substrate surface.

Next description will be made on how module 1 is connected to the base substrate after the evaluation is completed. The module connected to the base substrate forms a surface-mounted module together with the base substrate, and achieves the specified function by operations of each circuit element with power supplied from the base substrate. FIG. 5 is a diagram showing a wiring pattern on the base substrate surface. In the figure, the position to which the module is mounted is shown by solid line 16. Terminals 13, 14 (FIG. 4) of module 1 are connected to connection wiring 15 on the base substrate and are electrically connected to each other, grounding electrode 10 (FIG. 4) of module 1 is connected to grounding wiring 40 installed as if it surrounds connection wiring 15. Or grounding electrode 10 (FIG. 4) of module 1 may be connected to grounding wiring (not illustrated) installed on both sides of connection wiring 15 so as to put connection wiring 15 between them.

Because a coplanar-type line is configured by arranging grounding wiring 40 symmetrically so as to surround connection wiring 15 or so as to put connection wiring 15 in-between, the electric field can be confined between the grounding wiring and the connection wiring. That is, by arranging grounding wiring 40 symmetrically in a equal distance from connection wiring 15 in such a manner to surround connection wiring 15 or to put connection wring 15 in-between, the wiring is less subject to influence of the lower layer of base substrate or the upper layer of module 1. Consequently, both circuit elements 7, 8 (FIG. 3) can be connected without impairing the high-frequency characteristics. After connecting module 1 to base substrate, it can be used for various applications as a module mounted on the substrate surface, which is called as surface-mounted module, in the same way as in the conventional cases. Needless to say, it is possible to evaluate the overall surface-mounted module.

According to the present embodiment, because terminals 13, 14 (FIG. 4) of circuit elements 7, 8 are installed nearly at the center of the rear surface, they are less susceptible to electromagnetic influences from the surrounding section of module 1, and other terminals can be disposed in the periphery of the module. Consequently, the degree of freedom when module 1 is mounted is improved. In addition, according to the present embodiment, because the ground electrode 10 (FIG. 4) on the rear surface of module 1 is disposed not to surround terminals 13, 14 (FIG. 4) of circuit elements 7, 8, the evaluation can be made with evaluation wiring 11 separated from the module grounding electrode on the evaluation board. Consequently, evaluation wiring 11 can be formed on the same surface as other wiring 4 and the evaluation board can be easily fabricated and at the same time, reduced cost can be achieved.

(Embodiment 2)

In Embodiment 2, a configuration of the module and the base substrate different from those in Embodiment 1 will be described. Because the superficial configuration of the module is the same as that shown in FIG. 3, the description will be omitted.

Figure 6:
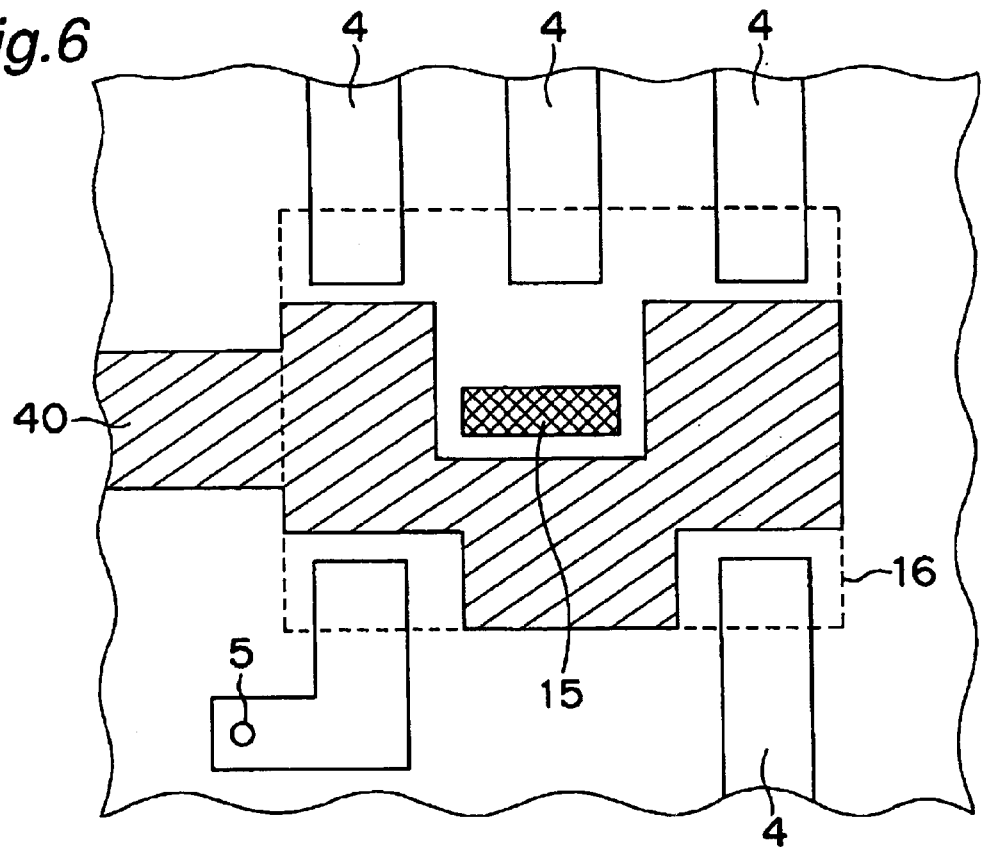
FIG. 6 is a diagram of a wiring pattern of the base substrate surface according to Embodiment 2.
Figure 7:
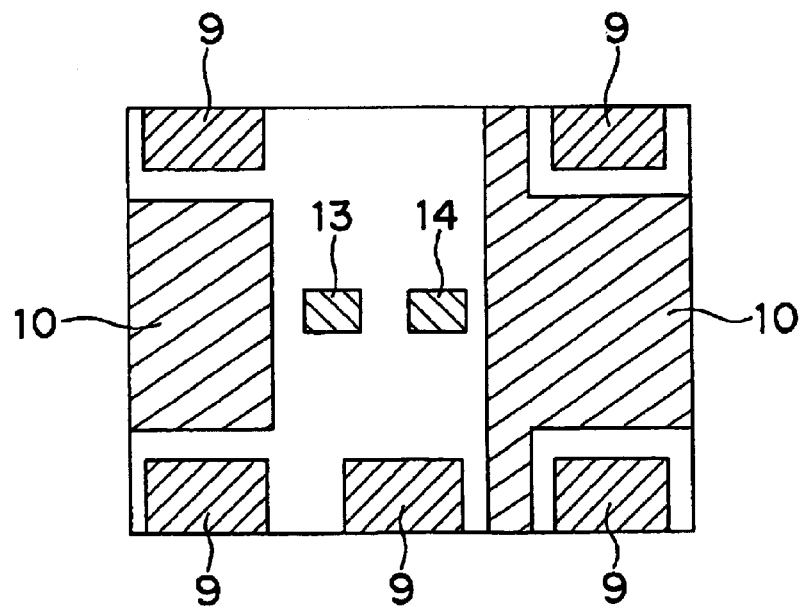
FIG. 7 is a diagram of rear surface of the module according to Embodiment 2.

FIG. 6 is a diagram showing a wiring pattern of the base substrate surface according to Embodiment 2. FIG. 7 is a diagram showing the module rear surface according to Embodiment 2. First, refer to FIG. 7, and it is understood that the number of electrodes 9 differs from that shown in FIG. 5. That is, in Embodiment 2, three electrodes 9 are disposed on one side of the module rear surface. As a result, shape of grounding electrode 10 is also changed. Shape and location of terminals 13, 14 of circuit elements 7, 8 (FIG. 3) are not changed.

Next description will be made on the pattern of FIG. 6 with respect to the configuration of the module rear surface shown in FIG. 7. In FIG. 6, a position to which the module is to be mounted is shown by a dotted line 16. Three pieces of wiring 4 disposed adjacently are connected to three electrodes 9 (FIG. 7) disposed on one side of the module. On the side on the substrate to which three pieces of wiring 4 are mounted, grounding wiring 40 is not disposed. According to this configuration, the free region can be effectively utilized by disposing a plurality of wiring 4 (for example, 3 or more wiring 4) and the number of module electrodes can be set flexibly. In addition, connection wiring 15 which is a signal line, and grounding wiring 40 which is a grounding electrode, are installed on the same plane. In other words, wiring 4 and grounding wiring 40 form a slot-type line. Because electric field is confined between grounding wiring 40 and connection wiring 15, the terminals can be less subject to influences of the lower layer of base substrate or the upper layer of the module.

In Embodiment 2, the description is made with the number of electrodes 9 set to a total of 5 and three of them disposed on one side and two of them on the other side. However, the person skilled in the art could suitably change the number and the locations of electrodes 9 and it is understood that the locations and the profile of grounding electrodes 10 can also be changed.

(Embodiment 3)

Figure 8:
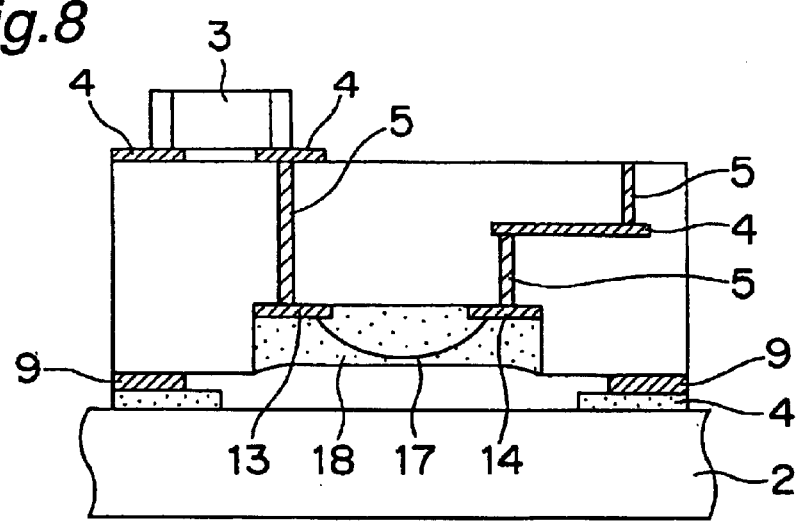
FIG. 8 is a cross-sectional view of a module according to Embodiment 3 mounted on a base substrate.

FIG. 8 is a cross-sectional view of the module according to Embodiment 3 mounted on base substrate 2. The rear surface of the module according to Embodiment 3 has the peripheral regions of terminals 13, 14 of circuit elements recessed with respect to the outer circumferential section of the rear surface. That is, terminals 13, 14 of circuit elements are disposed on a plane recessed from the outer circumferential surface on the module rear surface, which also is called as a recessed section. Because terminals 13, 14 are separated from base substrate 2 from a predetermined distance, they are less susceptible to influence from base substrate 2. In the figure, the overall circuit elements 7, 8 (FIG. 3) are not shown, but a part of them (chip parts 3, wiring 4, via hole 5) are shown.

A bonding wire 17 newly shown secures a connection between terminals 13, 14 of circuit elements. Connection will take place after the high-frequency characteristics of each circuit element are evaluated by means of each terminal 13, 14 and the circuit elements are sorted and adjusted. The configuration when the high-frequency characteristics are evaluated will be later discussed referring to FIG. 9. When bonding wire 17 is connected, the recessed section is filled with potting material 18. Potting material 18 includes glass, resin, etc. and fixes bonding wire 17 and prevents terminals from shorting when solder rises to terminals 13, 14 at the time of reflow process.

Figure 9:
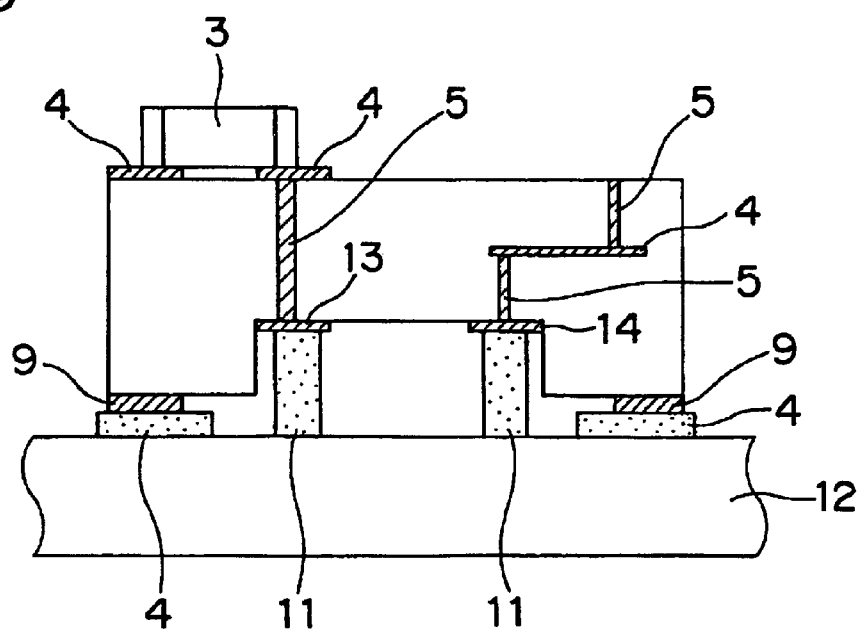
FIG. 9 is a cross-sectional view of the module and the evaluation board when the module according to Embodiment 3 is evaluated.

FIG. 9 is a cross-sectional view of the module and evaluation board 12 when the module according to module is evaluated. By bringing the module in contact with evaluation board 12, the high-frequency characteristics of each circuit element can be evaluated. However, because terminals 13, 14 of the module are disposed at the recessed section, the evaluation wiring of evaluation board 12 is disposed protruded to the side where the module is disposed so that electrical connections with terminals 13, 14 are secured. In this figure, a part of the circuit elements (chip parts 3, wiring 4, via hole 5) only are shown, too.

In the present embodiment, terminals are disposed at the recessed section of the module rear surface. After high-frequency characteristics are evaluated to sort and adjust circuit elements, terminals are connected by wire. Consequently, since modules can be manufactured at a high process yield, manufacturing cost of the module can be reduced. Furthermore, since the evaluation terminal to be connected later is disposed on the rear surface of module 1, the area of the top layer of module 1 to which a large number of chip parts are mounted can be secured and the degree of design freedom can also be improved.

In the above description, terminals 13, 14 are connected by bonding wire 17. However, they may be connected using LCR chip parts, metal chip semiconductor devices, etc. in place of bonding wire 17.

(Embodiment 4)

Figure 10:
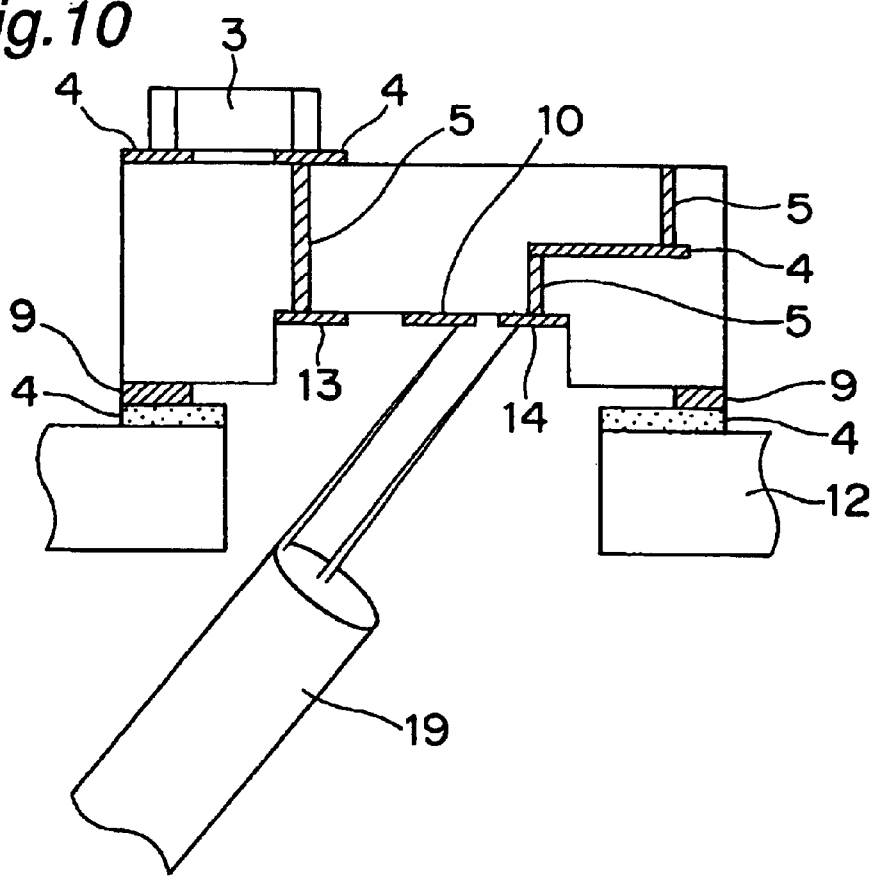
FIG. 10 is a diagram explaining the module evaluation using probe needle according to Embodiment 4.

FIG. 10 is a diagram explaining evaluation of the module using a probe needle 19. On the module rear surface, a recessed section is provided in the same manner as Embodiment 3. To the recessed section of FIG. 10, grounding electrode 10 is further disposed. In the following, a case for evaluating the circuit element equipped with terminal 14 will be described.

First of all, a module is placed on evaluation board 12, module electrode 9 and wiring 4 on evaluation board 12 are brought into contact to each other, and are electrically connected. Under this condition, probe needle 19 for radio frequency (RF) is contacted with terminal 14 of the circuit element and grounding electrode 10. By evaluating the circuit element using probe needle 19 in this way, it is possible to evaluate the specific circuit element only without causing unrequired reflection and/or loss in the microwave band. Note that, after the evaluation of the high-frequency characteristics, terminals 13, 14 of the recessed section on the module rear surface are connected by wire, etc. and the recessed section is filled with the potting material.

Because in the present embodiment, grounding electrode 10 and terminals 13, 14 of the two circuit elements are disposed at the recessed section of the module rear surface, the signal needle and the grounding needle of probe needle 19 can respectively contact with the module terminal and the grounding electrode located in close proximity, and the high-frequency characteristics of each circuit element can be individually evaluated. By sorting out and adjusting each of the circuit elements using the evaluation results, modules can be manufactured at a high process yield and the module manufacturing cost can be reduced. In addition, because the circuit elements are separated from base substrate 2 in the predetermined distance as is the case of the module of Embodiment 3, the circuit elements can be less subject to influences from base substrate 2.

In the present example, electrode 9 and wiring 4 of evaluation board 12 are connected, but all of these may be brought into contact with the probe needle. The description is made on the case in which only a single grounding electrode 10 is used, but grounding electrodes may be disposed at two or more places and so-called GSG connection may be formed.

(Embodiment 5)

Figure 11:
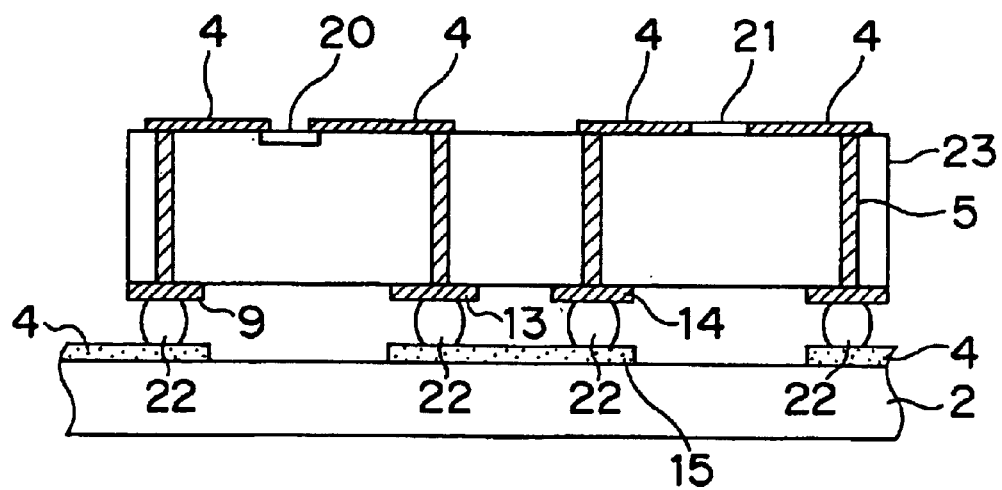
FIG. 11 is a cross-sectional view of a semiconductor apparatus mounted on the base substrate according to Embodiment 5.

FIG. 11 is a cross-sectional view of a semiconductor device mounted on base substrate 2 according to Embodiment 5. In Embodiment 5 and Embodiment 6 (later discussed), among the module or substrates mounted with modules (surface-mounted modules), the surface-mounted module in which the module and/or the substrate includes semiconductors as component elements is called a semiconductor device. In the present embodiment, the semiconductor device includes semiconductor substrates 23 such as GaAs, Si, etc. and various elements installed on the surface. In the figure, wiring 4, FET 20, MIN capacitor 21 are shown as circuit elements. Electrodes 9, 13, 14 on the rear surface of substrate 23 are connected to the circuit on the surface layer by way of via hole 5. In addition, electrodes 9, 13, 14 are connected to base substrate 2 by bumps 22 fabricated with solder or gold. Electrode 13 of one circuit element and electrode 14 of the other circuit element are connected via bumps 22 and connection wiring 15 on base substrate 2.

The semiconductor can be evaluated by contacting probe needle 19 (FIG. 10) with each electrode on the semiconductor substrate rear surface in the form of bare chip or wafer before forming bumps. Consequently, as is the case of the module in Embodiments 1 through 4, high-frequency evaluation of each circuit element contained in the semiconductor device can be executed for each section. Because by sorting out and adjusting each of the circuit elements using the evaluation results, semiconductor devices can be manufactured at a high process yield, the manufacturing cost of semiconductor devices can be reduced. In addition, since the circuit is formed in the semiconductor device and adjusting and sorting out are carried out, the module can be still more downsized and have the weight still more reduced from the module according to Embodiment 1.

In the present embodiment, the semiconductor device and base substrate 2 are connected using bumps 22. However, the semiconductor device may be connected to base substrate 2 by solder reflow process, resin bonding, or other means in place of bumps 22.

(Embodiment 6)

Figure 12:
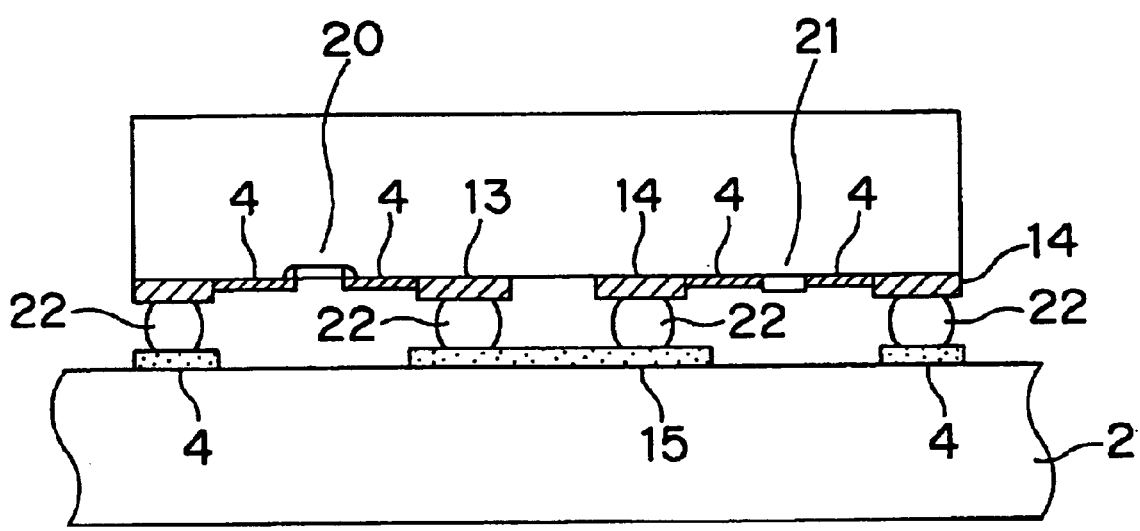
FIG. 12 is a cross-sectional view of a semiconductor apparatus mounted on the base substrate according to Embodiment 6.

FIG. 12 is a cross-sectional view of a semiconductor device mounted on base substrate 2 according to Embodiment 6. Primary difference from the semiconductor device according to Embodiment 5 lies in the adoption of the flip chip configuration in which the semiconductor device is disposed by turning it over. As a result of the adoption, further difference lies in omission of via holes 5 for securing electrical connection to the rear surface. Because of the flip chip configuration, the semiconductor device according to the present embodiment has all the circuit elements and pads for forming bumps disposed on one surface of the semiconductor device. The circuit elements of the semiconductor device are connected to base substrate 2 by connection wiring 15 on the base substrate in time of flip chip mounting.

The semiconductor device is evaluated in the bare chip or wafer condition before forming bumps by bringing probe needle 19 (FIG. 10) in contact with each electrode of circuit elements of the semiconductor substrate. Consequently, as is the case of modules in Embodiments 1 through 4, the high-frequency evaluation of each circuit element contained in the semiconductor device can be carried out for each section. Because by sorting out and adjusting each of the circuit elements using the evaluation results, semiconductor devices can be manufactured at a high process yield, the manufacturing cost of semiconductor devices can be reduced. In addition, the semiconductor devices are flip-chip arranged, no via hole is required, and semiconductor devices can be manufactured at still lower cost than the semiconductor devices according to Embodiment 5. In addition, since circuit-separated pads are installed in the semiconductor devices, the semiconductor devices can be still more downsized as compared to the module according to Embodiment 1.

Now, embodiments 1 through 6 according to the present invention have been described. In the present specification, the case of two circuit elements is described, but three or more circuit elements may exist. In such event, to the module or the semiconductor device, electrodes corresponding to each circuit element and isolated from each other are disposed and are allowed to conduct on the base substrate.

It will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A surface-mounted module comprising:

a module including a module substrate having opposed front and rear surfaces, and a plurality of circuit elements mounted on the front surface of the module substrate and electrically insulated from one another, each circuit element including a terminal on the rear surface of the module substrate and insulated from the terminals of the other circuit elements;

electrically conducting vias extending between the front and rear surfaces of the module substrate and electrically connecting respective circuit elements on the front surface of the module substrate to respective terminals on the rear surface of the module substrate; and a base substrate that supplies electric power to the module and includes connection wiring electrically connecting together, at the rear surface of the module substrate, the terminals of at least two of the plurality of circuit elements that are mounted on the front surface of the module substrate, wherein each circuit element is operated in response to power supplied through the base substrate via the connection wiring.

2. The surface-mounted module according to claim 1, wherein the module comprises, on the rear surface of the module substrate, a grounding electrode for grounding at least one of the circuit elements, the base substrate comprises grounding wiring that connects and grounds the grounding electrode of the module and that surrounds the connection wiring, and the connection wiring and the grounding electrode form a coplanar line.

3. The surface-mounted module according to claim 1, wherein the module comprises, on the rear surface of the module substrate, a grounding electrode for grounding at least one of the circuit elements, the base substrate comprises a second grounding electrode that connects and grounds the first grounding electrode, and the connection wiring and the grounding electrode form a slot line.

4. The surface-mounted module according to claim 2, wherein the grounding electrode on the rear surface of the module substrate surrounds the terminals.

5. The surface-mounted module according to claim 3, wherein the grounding electrode on the rear surface of the module partially surrounds the terminals.

6. A surface-mounted module comprising:

a module including:
 a module substrate having opposed front and rear surfaces;
 a plurality of circuit elements mounted on the front surface of the module substrate and electrically insulated from one another, each circuit element including a terminal on the rear surface of the module substrate;
 electrically conducting vias extending between the front and rear surfaces of the module substrate, respectively electrically connecting respective terminals to respective circuit elements;
 a conductor connecting two of the terminals together electrically; and
 a grounding electrode on the rear surface of the module substrate for grounding each of the circuit elements; and a base substrate connecting and grounding the grounding electrode of the module and through which electric power is supplied to the circuit elements of the module, wherein the rear surface includes a recessed surface, located between the front and rear surfaces, and at least one of the terminals is electrically accessible at the third surface.

7. The surface-mounted module according to claim 6, including a potting compound covering the recessed surface and the conductor.

8. The surface-mounted module according to claim 6, wherein the grounding electrode is on the recessed surface.

9. The surface-mounted module according to claim 6, wherein the conductor is at least one of a conductive wire, a conductive chip, and metal.

10. The surface-mounted module according to claim 7, wherein the conductor is at least one of a conductive wire, a conductive chip, and metal.

11. The surface-mounted module according to claim 8, wherein the conductor is at least one of a conductive wire, a conductive chip, and metal.

12. The surface-mounted module according to claim 6, wherein at least one of the terminals is electrically accessible at the rear surface of the module substrate.

* * * * *